US008806095B2

(12) United States Patent
Cheng

(10) Patent No.: US 8,806,095 B2
(45) Date of Patent: Aug. 12, 2014

(54) ELECTRONIC MEASURING DEVICE AND METHOD OF CONVERTING SERIAL DATA TO PARALLEL DATA FOR STORAGE USING THE SAME

(75) Inventor: Chiu-Hao Cheng, New Taipei (TW)

(73) Assignee: Zeroplus Technology Co., Ltd., New Taipei (TW)

( * ) Notice: Subject to any disclaimer, the term of this patent is extended or adjusted under 35 U.S.C. 154(b) by 192 days.

(21) Appl. No.: 13/348,837

(22) Filed: Jan. 12, 2012

(65) Prior Publication Data

US 2012/0198109 A1 Aug. 2, 2012

(30) Foreign Application Priority Data

Jan. 31, 2011 (TW) .............................. 100103525 A

(51) Int. Cl.
*G06F 3/00* (2006.01)
*G06F 5/00* (2006.01)
*G06F 13/12* (2006.01)
*G06F 13/28* (2006.01)
*G11C 29/56* (2006.01)
*G01R 13/00* (2006.01)

(52) U.S. Cl.
CPC ................ *G01R 13/00* (2013.01); *G11C 29/56* (2013.01); *G11C 2029/5606* (2013.01)
USPC .......... 710/71; 710/2; 710/6; 710/14; 710/20; 710/31; 710/38

(58) Field of Classification Search
USPC ............................ 710/71, 2, 6, 14, 20, 31, 38
See application file for complete search history.

(56) References Cited

U.S. PATENT DOCUMENTS

| 4,780,814 | A | * | 10/1988 | Hayek ............................ 710/105 |
| 5,142,628 | A | * | 8/1992 | Okochi et al. ................. 709/212 |
| 5,305,441 | A | * | 4/1994 | Okochi et al. ................... 710/40 |
| 5,535,328 | A | * | 7/1996 | Harari et al. .................. 714/6.32 |
| 5,761,465 | A | * | 6/1998 | Nimishakvi et al. ........... 710/316 |
| 5,809,341 | A | * | 9/1998 | Nimishakvi et al. ............. 710/60 |
| 7,191,262 | B2 | * | 3/2007 | Sleeman ......................... 710/62 |
| 7,272,677 | B1 | * | 9/2007 | Venkata et al. .................. 710/71 |
| 8,335,878 | B2 | * | 12/2012 | Lee et al. ........................ 710/71 |
| 2006/0149870 | A1 | * | 7/2006 | Sears et al. ...................... 710/71 |
| 2009/0113092 | A1 | * | 4/2009 | Hung et al. ...................... 710/71 |

* cited by examiner

*Primary Examiner* — Ernest Unelus
*Assistant Examiner* — Getente A Yimer
(74) *Attorney, Agent, or Firm* — Chun-Ming Shih

(57) ABSTRACT

An electronic measuring device includes a detection channel module, a sampling module, a control unit, a data path selector and a memory device. A user will be able to selectively enable the desired detection channels and store only data collected from enabled channels. The data collected from the detection channels are in serial data form. The device utilizes a serial-parallel shifter in its sampling module to convert the serial data to parallel data bytes. Two indicators in the storage unit of the memory device allow users to effectively store the parallel data bytes in designated locations. The innovative data conversion and storage methods of this invention will significantly conserve memory space that otherwise will be occupied by data from the disabled channels and allow accurate and efficient reading of the stored data.

6 Claims, 7 Drawing Sheets

ELECTRONIC MEASURING DEVICE AND METHOD OF CONVERTING SERIAL DATA TO PARALLEL DATA FOR STORAGE USING THE SAME

BACKGROUND OF THE INVENTION

1. Field of the Invention

The present invention relates to an electronic measuring device, a method of converting serial data to parallel data Bytes and a method to store the parallel data bytes. Particularly, the electronic measuring device is capable of conducting data analysis on sample data collected from its detection channels, storing the data efficiently in its memory and accurately reading the stored data.

2. Related Prior Arts

In an ever increasing digitalization of today's electronic products, the traditional oscilloscope is no longer capable of detecting signals from more than 8 to 16 channels. Although the in-circuit emulator (ICE) can solve many problems relating to digitalization, the actual time sequence problems still cannot be dealt by software-based in-circuit emulator. Additionally, ICE typically requires specialized computer systems specially designed for the software. As a result, a logic analyzer has become one of the most important devices for all computer engineers today. The logic analyzer is a circuit analysis device capable of placing sampled data in a structured format and conveniently displaying the operation of a digital circuit on a displaying screen.

During its detection process, a conventional logic analyzer, through its multiple detection channels, receives signals from the pins of an electronic component on one-on-one basis. This process is often referred to as data sampling. After data sampling, the detection channels send the data samples to a memory storage, and the data can then be shown on a display for reviews by the engineers. FIG. 1 is a diagram showing the data storage architecture of a conventional logical analyzer. Under the conventional technology, the data stored in the logic analyzer contains all data sent to the memory 3 from all detection channels 21 in the detection channel module 2 in serial order. Although some of the detecting channels may not have received any electronic signals from the external device 1, those channels will transfer blank data to be stored in the memory 3 and fill up the memory when every time data is being transferred from the detection channels. With this type of storage method, in order to accurately read the data stored in the memory, detection channels must send blank data to the storage memory 3 even if they received. no signal from the external device 1. Consequently, all spaces in the storage memory are filled up when every time data is being transferred to the memory, which results in unnecessary waste of memory space.

Because of the above mentioned drawback, many other types of logic analyzers are developed by the industry with an aim to solve the problem. FIG. 2 is a diagram of another commonly known logic analyzer. Its detection channel module 4 has 16 detection channels 41 capable of receiving electrical signals from an external device 1. Similar to the logic analyzer shown in FIG. 1, the data received from the detection channels are transferred to the storage memory 3 in serial order. Unlike the previous logic analyzer, the detection channels 41 which do not receive data from the external device 1 do not send blank data to the memory. Although this type of logic analyzer is capable of utilizing memory storage more efficiently, it does not distinguish the data stored in its memory 3. It simply collects data from each detection channels and stores the data into the storage memory continuously. Because the data are not distinguished. by their source, the user must conduct complex analysis on the data to determine where each data bit comes from. Additionally, software used to conduct such analysis significantly increases the use of computing resources. Furthermore, when the memory 3 is depleted, the newly acquired data will overlay the stored data from the beginning of the data array. The overlay will result in the loss of the starting point of the data array and cause error in the data analysis.

The present invention will solve the above mentioned shortcomings of the existing conventional logic analyzer by providing a data processing and storage method that converts serial data to parallel data and store them efficiently in the memory.

SUMMARY OF THE INVENTION

The present invention is to provide an electronic measuring device comprises a detection channel module, a control unit, a sampling module, a data path selector and a memory device.

The detection channel module includes at least one detection channel capable of receiving serial data output by an external device. The control unit includes a channel enabler that sends out channel enabling signals to control the output of the serial data from the detection channels. The sampling module further includes at least one serial-to-parallel converter and at least one corresponding first-in-first-out (FIFO) register. The serial-to-parallel converter is capable of receiving serial data from its corresponding detection channel, converting them into parallel data and transferring the data to its corresponding FIFO register. The data path selection unit is capable of receiving parallel data from the sampling module and outputs the parallel data in an order according to the signals sent by the control unit. The memory device further includes a memory controller and a storage unit. The memory controller is capable of receiving parallel data from the data path selector and transferring the data to a designated location in the storage unit.

The serial-to-parallel converter in the sampling module further includes a converter controller and a serial-parallel shifter. When the converter controller receives signals from the channel enabler, it causes the serial-parallel shifter to continuously receiving serial data from its corresponding detection channel and converting them into parallel data. The serial-parallel shifter has limited storage capacity. When it reaches full capacity, the serial-parallel shifter will send a signal to the converter controller, and the converter controller will then cause the stored data to be transferred to FIFO register as a data byte.

The storage unit in the memory device includes a first indicator and a second indicator. The first indicator points to starting address where the first parallel data byte output by the data path selector will be stored. The second indicator points to the address where the next parallel data byte will be stored. Thus, the memory device will be able to use the second indicator as a reference to where data should be stored every time a data byte is received. When the storage unit reaches full capacity, the second indicator will move back to address where the first indicator is. The first indicator will then move to the next address according to the number of enabled channels.

The present invention provides a user to selectively enable only the needed detection channels. The user will be able to use the enabled channels to receive signals from the external device and output serial data to the sampling module. The data path selector stores the parallel data into the memory device in an efficient manner. The innovative serial-to-parallel data conversion method creates an accurate and effective data structure for storage purpose. The conversion method also solves the problem that when the number of detections channels is different from the length of the storage unit, data will be split and stored in different location.

Additionally, the innovated storage method increases memory use efficiency. With the indicators in the storage unit, there is no more need to determine where the data needs to be stored when every time data is transferred to the storage unit. Without the indicators, data reading becomes increasingly complicated and requires a large amount of computing resources. For these reasons, this invention will increase the storage speed and processing efficiency.

The following are implementation steps of the serial-to-parallel conversion method used by the electronic measuring device according to the present invention.

1. A signal terminal of an external device is connected to a detection channel;
2. The detection channel is enabled by a channel enabler in the control unit;
3. The enabled detection channel takes samples from the signals received from signal terminal and outputs the data sample in serial data form;
4. A sampling unit converts the serial data into parallel data and stores them temporarily;
5. A data path Selector outputs the parallel data from the sampling unit into a memory device; and
6. A memory controller causes the data to be stored in the location specified by a second indicator in the storage unit.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description and technical contents of the present invention will be explained with reference to the accompanying drawings. However, the drawings are illustrative only but not used to limit the present invention.

Figure 1:
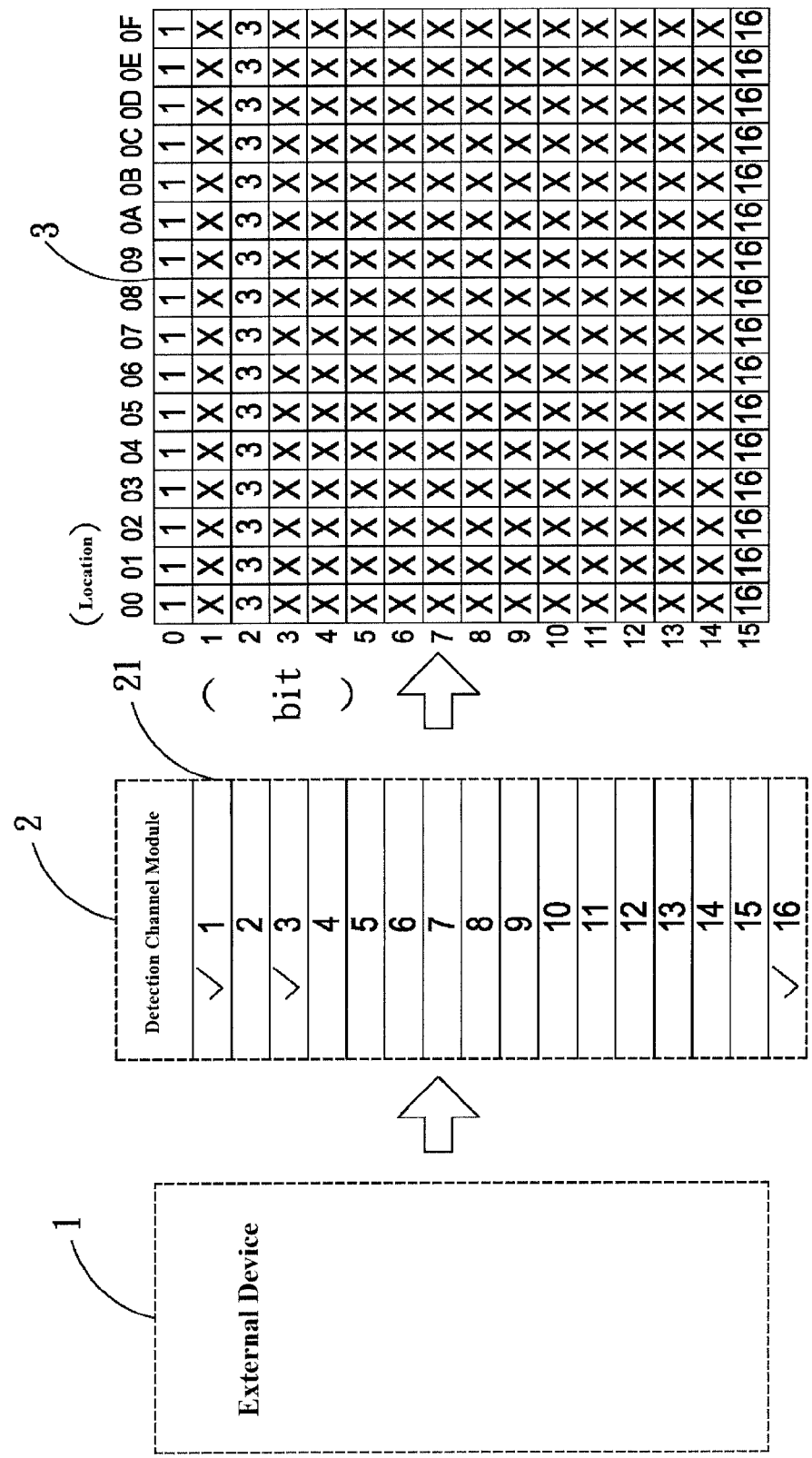
FIG. 1 is a diagram showing the data storage architecture of a conventional logic analyzer.
Figure 2:
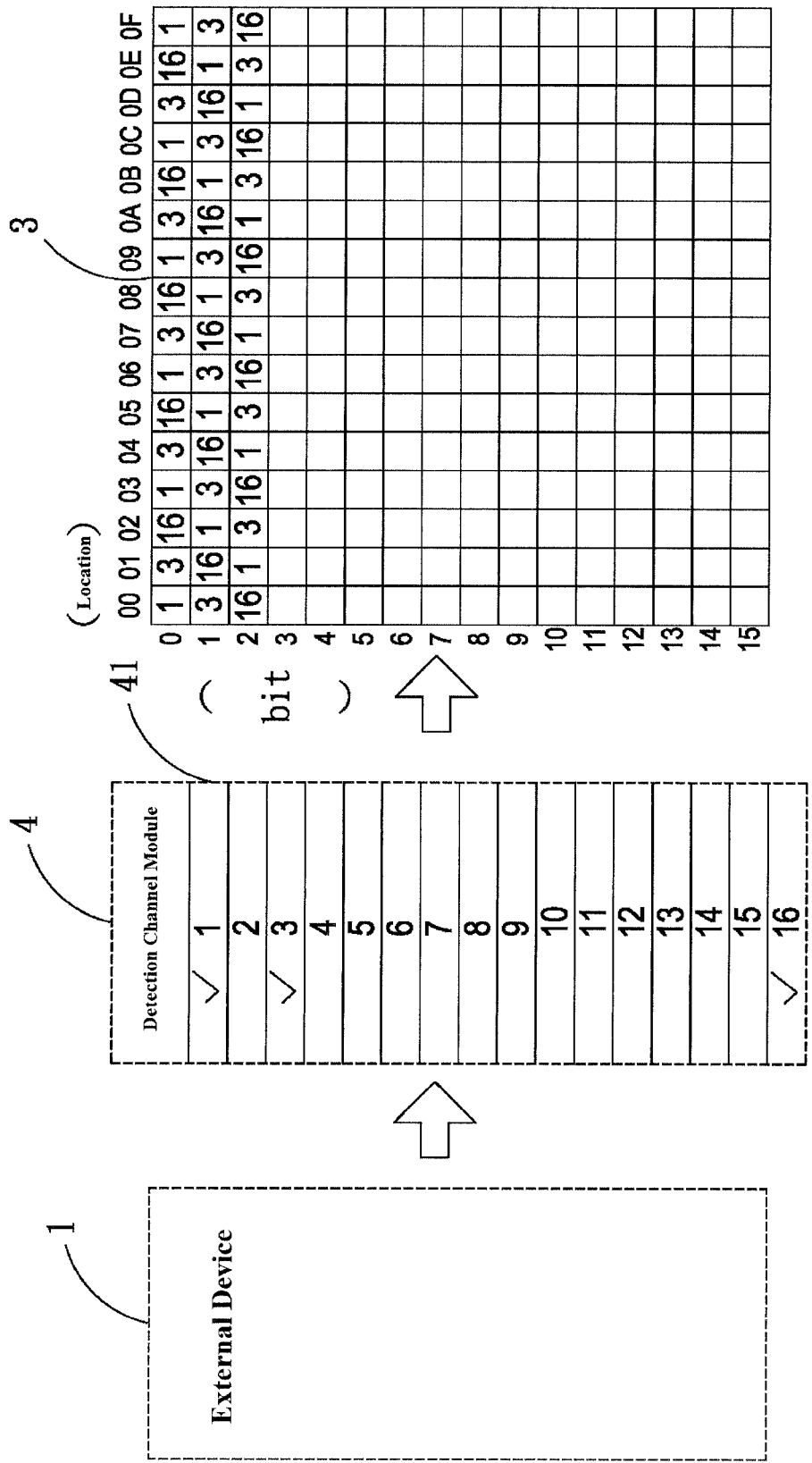
FIG. 2 is a diagram showing the data storage architecture of another conventional logic analyzer.
Figure 3:
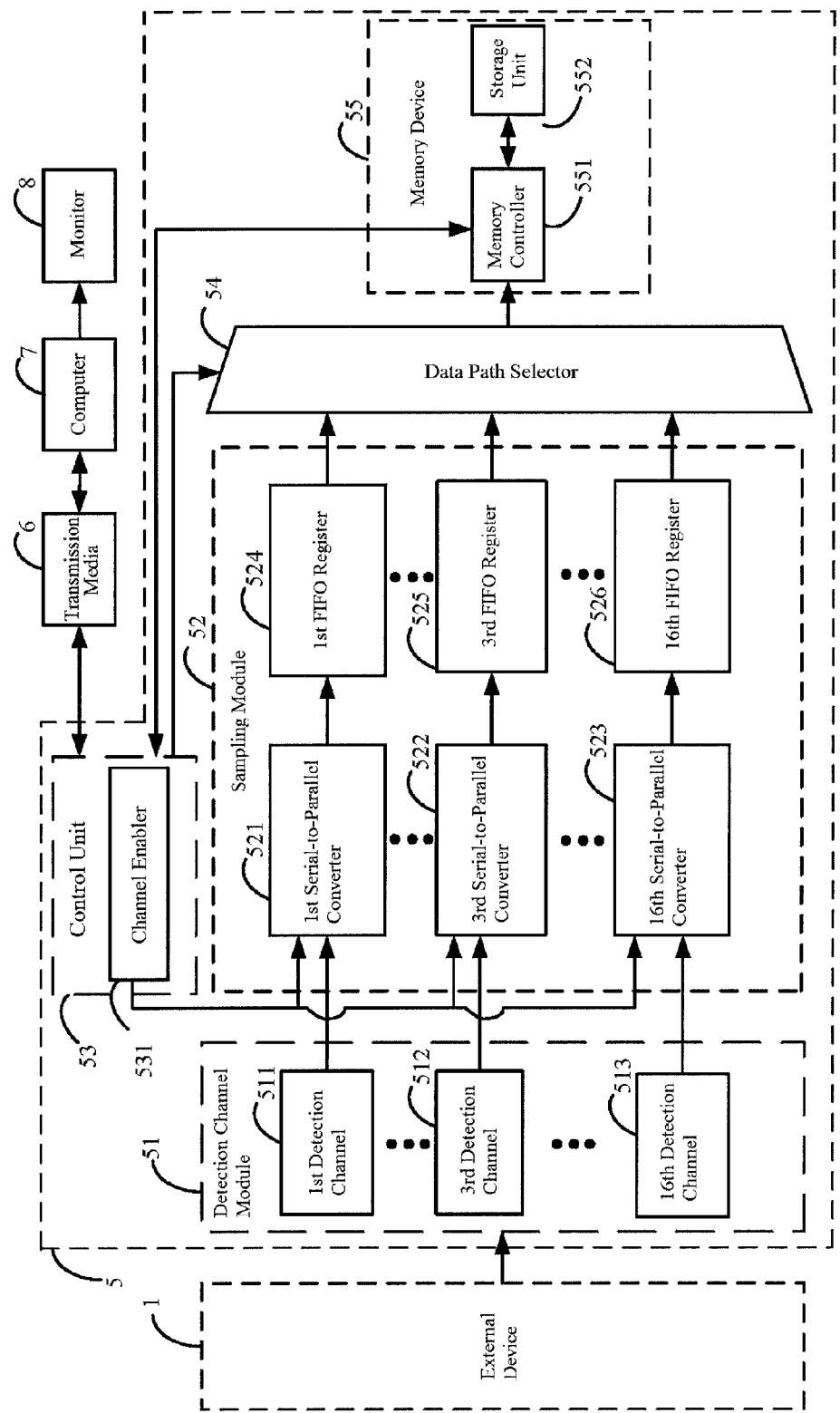
FIG. 3 is a block diagram of an electronic measuring device according to the present invention.

FIG. 3 is a block diagram of an embodiment according to the present invention. The block diagram shows the major components of the invention. As shown in FIG. 3, the electronic measuring device 5 is connected to an external device 1. The external device 1 sends electronic signal to the electronic measuring device 5 allowing a user to use the electronic measuring device 5 to conduct electronic measuring through the external device 1. The data collected by the electronic measuring device 5 can be transmitted to a computer 7 through a transmission interface 6. A monitor 8 is connected to the computer 7 to display the data to the user.

In this embodiment, the electronic measuring device 5 is a logic analyzer. Its main utility is to detect electronic signals sent by the external device 1 and conduct measuring on those signals. The electronic measuring device 5 includes a detection channel module 51, a control unit 53, a sampling module 52, and a memory device 55. A 16-channel detection channel module is used to demonstrate the invention. The operation concept of all such electronic measuring devices 5 is the same as the one in this embodiment. Therefore, variation in number of detection channels will not make a difference in how the device functions.

In this embodiment, the user will be able to selectively enable any detection channel in the detection channel module 51 according to the measuring need. The detection channel module 51 includes 16 detection channels. The enabled detection channels in FIG. 3 are the $1^{st}$ detection channel 511, the $3^{rd}$ detection channel 512, and the $16^{th}$ detection channel 513. These three enabled channels receive serial signals from the external device 1.

The control unit 53 includes a channel enabler 531. The channel enabler 531 is capable of sending a channel enabling signal to the detection channel module 51 to enable the detection channels needed for data sampling.

The sampling module 52 includes at least one serial-to-parallel converter corresponding to a detection channel. The sampling module 52 temporarily stores data from all channels and outputs the data as a data byte when the data reaches a certain capacity. For example, if the sampling module 52 collects 16 bits of data from a single detection channel, the 16 bits of data will be output as a single data byte, unlike the conventional logic analyzer which outputs the data sample in serial order without distinguishing the source of the data.

In this embodiment, there are 16 serial-to-parallel converters since there are 16 detection channels. Note, the number of functioning serial-to-parallel converters varies with the number of enabled detection channels. In FIG. 3, the functional serial-to-parallel converters are the $1^{st}$ unit 521, the $3^{rd}$ unit 522, and the $16^{th}$ unit 523 because the enabled channels are the $1^{st}$ detection channel 511, the $3^{rd}$ detection channel 512, and the $16^{th}$ detection channel 513.

The serial-to-parallel converter receives serial data from its corresponding detection channels and converts the serial data to parallel data bytes. For example, once the $1^{st}$ detection channel 511 is enabled by a signal sent from the channel enabler 531, it will start to output serial data to the $1^{st}$ serial-to-parallel converter 521. The $1^{st}$ serial-to-parallel converter 521 then converts the serial data into parallel data bytes and deposits them into the $1^{st}$ FIFO register 524 for temporary storage. Once the parallel data bytes are stored in the FIFO registers, the data path selector 54 will transfer the data bytes to the memory device 55 in sequence specified by signals sent from the channel enabler 531.

The memory device 55 consists of a memory controller 551 and a storage unit 552. The memory controller 551 receives parallel data bytes from the data path selector 54 and stores them into the storage unit 552 in sequential order.

Figure 4:
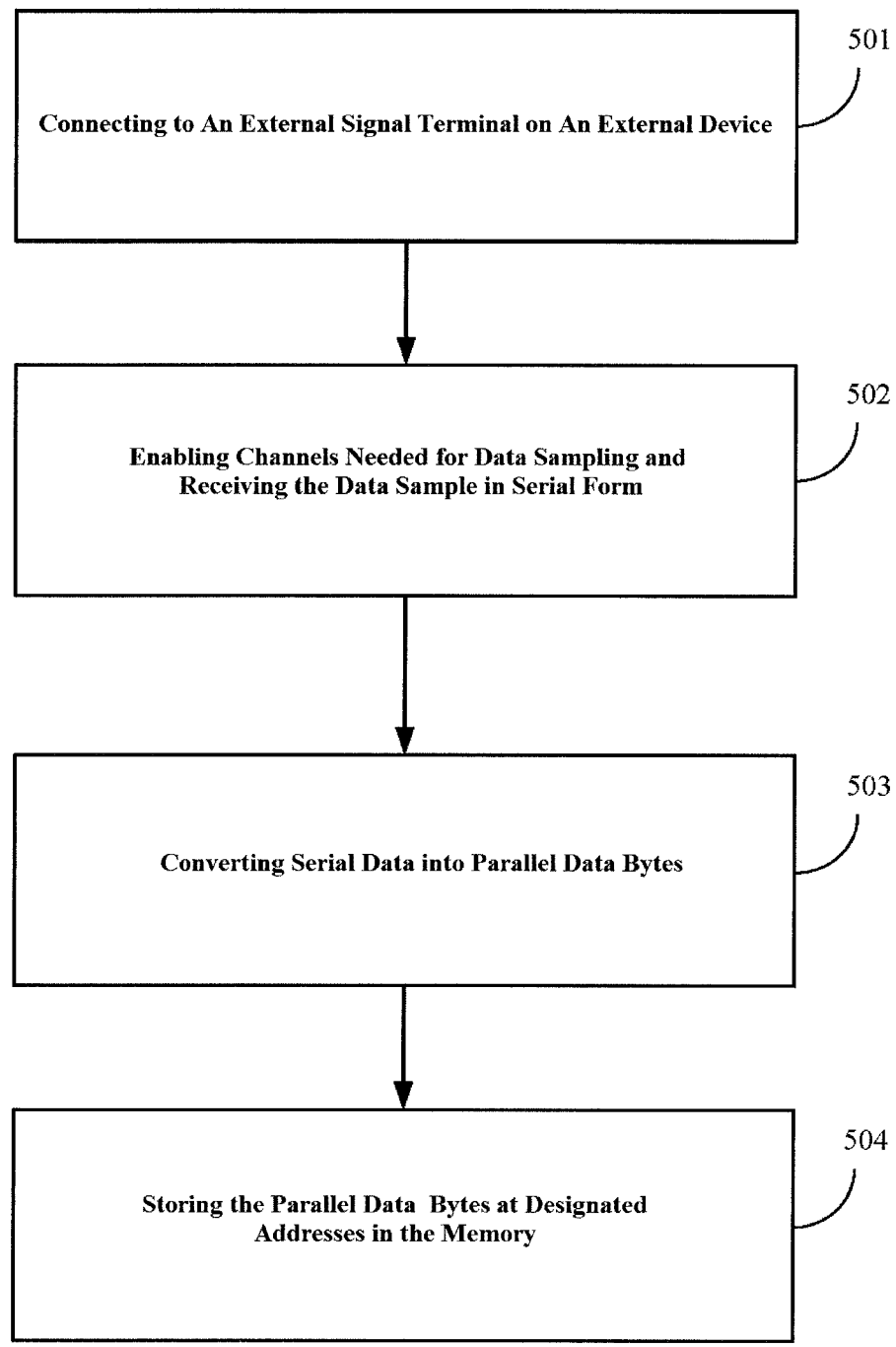
FIG. 4 is a flow chart of a serial-to-parallel data conversion process by an electronic measuring device according to the present invention.

FIG. 4 is a flow chart of the implementation of this electronic measuring device. The flow chart should be read in conjunction to the block diagram in FIG. 4 for better understanding. The device is first connected to an external signal terminal 501. Next, the needed channels are enabled, and data are received from the enabled detection channels as serial data bits 502. The sampling unit then converts the data into parallel data bytes 503. Finally, the parallel data bytes are stored in the storage units 504.

Figure 5:
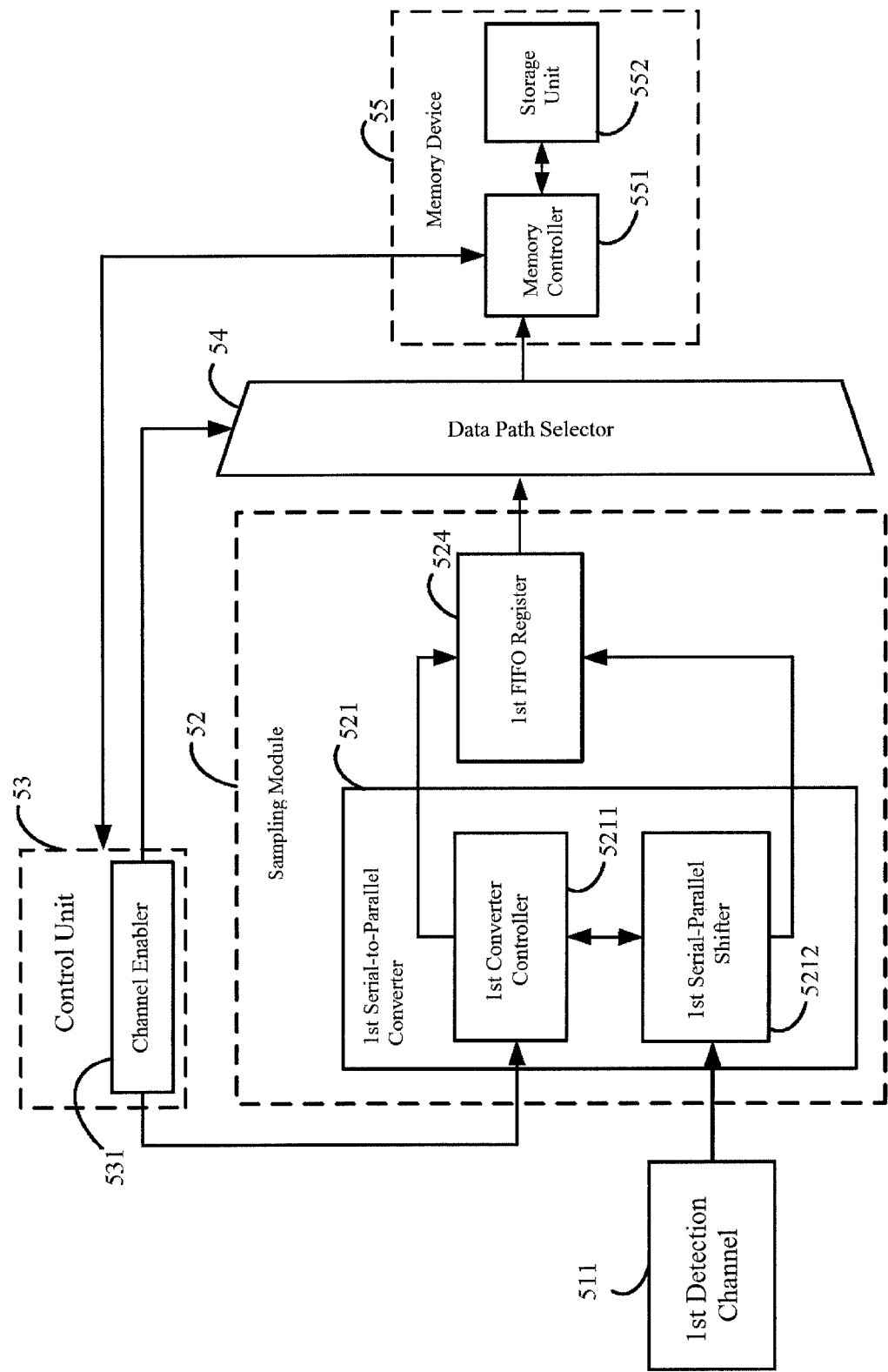
FIG. 5 is a detailed diagram of the sampling unit of the electronic measuring device according to the present invention.

FIG. 5 is a detailed block diagram of the $1^{st}$ serial-to-parallel converter 521 shown in relation to other components of the device. In FIG. 4, the embodiment is demonstrated using only the $1^{st}$ detection channel 511, the $1^{st}$ serial-to-parallel converter 521 and its corresponding FIFO register 524.

The $1^{st}$ serial-to-parallel converter 521 includes a $1^{st}$ converter controller 5211 and a $1^{st}$ serial-parallel shifter 5212. The $1^{st}$ converter controller receives channel enabling signal from the channel enabler 531 causing the serial-parallel shifter 5212 to continuously receiving data from the $1^{st}$ detection channel 511. The serial-parallel shifter 5212 of this invention is given a limited storage capacity. In this embodiment, the serial-parallel shifter 5212 is capable of storing 16 bits of data. When the data storage reaches full capacity, the data will form a parallel data byte. The serial-parallel shifter 5212 then sends a signal to the converter controller 5211 which in response will cause the data byte to be deposited into the $1^{st}$ FIFO register 524 for temporary storage. After the data bytes are deposited into the $1^{st}$ FIFO register 524, the FIFO register will transfer the data bytes in sequential order through the data path selector 54 into the memory device 55 for storage.

Figure 6:
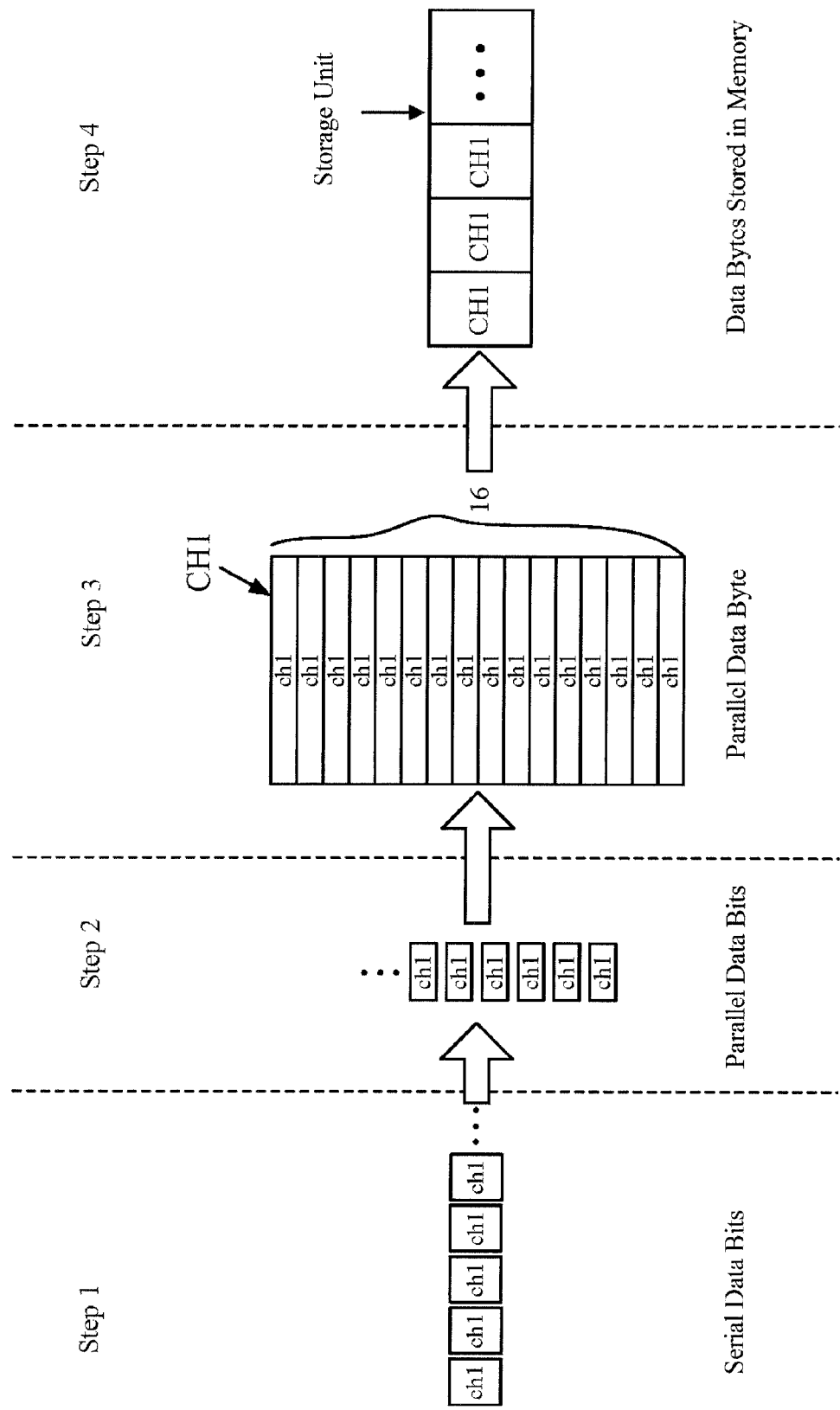
FIG. 6 is a diagram illustrating of the serial-to-parallel data conversion architecture according to the present invention.

FIG. 6 is a demonstration of how serial data are converted to parallel data bytes. As shown in step 1 of FIG. 6, the data ch1 are in serial order after they are received by the detection channel from the external device 1. The sampling module 52 will place the data in a parallel stack. See step 2 when the stack reached 16 bits, all the data bits in the parallel stack are output together a parallel data byte ch1 with 16 data bits ch1. Finally, the data bytes ch1 are stored in the memory device 55.

Figure 7:
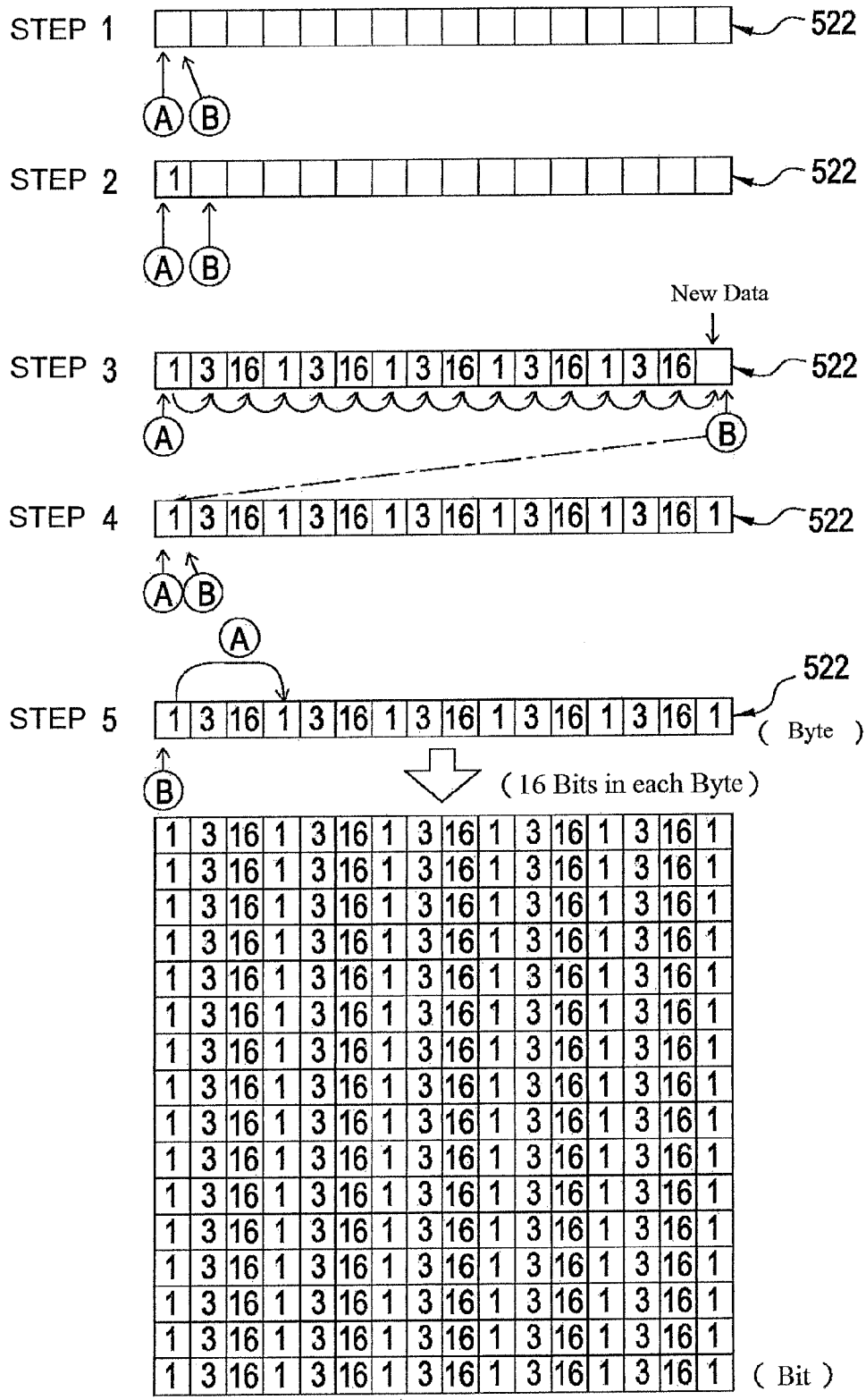
FIG. 7 is a diagram illustrating the storage architecture according to the present invention.

FIG. 7 demonstrates how the parallel data bytes are stored in the memory device. The storage unit 552 of the memory device 55 has a first indicator A and a second indicator B. The first indicator A points to the first address in the storage unit 552. The second indicator B points to the location where the next parallel byte will be stored. When the storage unit 552 is empty, the first indicator A and the second indicator B point at the same address. See step 1 when the first data byte is being stored into the storage unit 552, the second indicator B will move to the adjacent address where the next data byte will be stored while the first indicator A remains at the same address. See step 2 the function of the second indicator B is to allow the device to store data without the need to search for an available storage sector. As data bytes continue to be input into the storage unit 552, the second indicator B will continue to move to the next address. See step 3 when the storage unit 552 reaches full capacity, the second indicator B will move back to the first address where the first indicator A is. See step 4 at this point, the second indicator B and the first indicator A overlap. When the overlap occurs, the first indicator A will point to the next address according to a signal received from the channel enabler 531. The signal from the channel enabler 531 indicates the number of enabled detection channels. For example, because this embodiment has 3 enabled detection channels, the first indicator A will consequently move three spots from its original address as in step 5.

Following this concept, the user of the device can easily interpret the stored data based on the locations of the first indicator and second indicator. For example, in this embodiment, because the first indicator A always points to the data received from the $1^{st}$ detection channel, and because there are 16 bits of data stored in one address, the address will contain 16 bits of data received from the $1^{st}$ detection channel.

The application of the electronic measuring device, its serial-to-parallel conversion method and data storage method of this invention will provide the following advantages over other comparable technologies:

1. The user of this device will be able to conserve storage memory by selectively enabling the needed detection channels and store only the data from those enabled channels.
2. The indicators in the storage unit of the memory device will allow its users to accurately and effectively conduct data analysis on stored data eliminating the need to catalog and recombine data after they are collected.

What is claimed is:

1. An electronic measuring device, comprising:
   a detection channel module including a plurality of detection channels to receive serial data from an external signal terminal;
   a sampling module connected to the detection channel module, wherein the sampling module receives the serial data from the detection channel module, and the sampling module includes a plurality of serial-to-parallel converters and a plurality of first-in-first-out (FIFO) registers corresponding to the serial-to-parallel converter, respectively, and each serial-to-parallel converter receives the serial data from a corresponding detection channel to convert the serial data into parallel data bytes and output the parallel data bytes to a corresponding FIFO register, and the corresponding FIFO register stores the parallel data bytes temporarily;
   a control unit connected to the sampling module, wherein the control unit includes a channel enabler connected to the serial-to-parallel converters, and the channel enabler is capable of outputting a channel enabling signal to the detection channel module to enable a predetermined number of the detection channels needed for data sampling, which is for the sampling module to recognize the serial data received from each detection channel so as to enable a corresponding serial-to-parallel converter to receive the serial data;
   a data path selector connected to the FIFO registers of the sampling module and the control unit for receiving the parallel data bytes from the sampling module and outputting the parallel data bytes in a sequential arrangement according to a data path signal sent by the control unit; and
   a memory device connected to both the control unit and the data path selector, wherein the memory device includes a memory controller and a storage unit, the memory controller receives the parallel data bytes from the data path selector and stores the parallel data bytes into the storage unit, and the storage unit has a plurality of storage sectors, a first indicator, and a second indicator, wherein each storage sector has the same number of bits as each of the parallel data bytes transferred from the data path selector, the first indicator is pointed to the storage sector where a first parallel data byte from the data path selector is predetermined to be stored in, and the second indicator is pointed to another storage sector where the memory controller causes a next parallel data byte to be stored in,
   wherein all the parallel data bytes stored in the FIFO registers are transferred and stored in the storage unit in sequential order; as the parallel data bytes continue to be input into the storage unit, the second indicator continues to point to the next storage sector until the storage unit reaches the full capacity;
   when the storage unit reaches full capacity, the second indicator is pointed to the same storage sector at which the first indicator is pointed to, and the first indicator is then moved to be pointed to another storage sector based on the predetermined number of the enabled detection channels.

2. The device according to claim 1, wherein each serial-to-parallel converter further includes a converter controller and a serial-parallel shifter, the serial-parallel shifter is connected to the detection channel, the converter controller receives the enabling signal from the channel enabler and causes the serial-parallel shifter to continuously receive the serial data from the detection channel and to convert the serial data into the parallel data.

3. The device according to claim 2, wherein the serial-parallel shifter has a limited storage capacity, when the serial-parallel shifter reaches a full capacity, the stored data will form a parallel data byte, and the serial-parallel shifter will send a signal to the converter controller, and the converter controller will control the serial-parallel shifter to transmit the data byte into the FIFO register.

4. A method of converting serial data to parallel data by an electronic measuring device which includes a detection channel module, a sampling module, a control unit, a data path selector and a memory device, comprising the steps of:
   a. connecting an external signal terminal to receive serial data by the detection channel module;
   b. enabling a predetermined number of a plurality detection channels of the detection channel module to be used for signal sampling by the control unit;
   c. converting the serial data into parallel data bytes by a plurality of serial-to-parallel converters of the sampling module, wherein the detection channel module receives the serial data and the sampling module converts the serial data into the parallel data bytes; and
   d. storing the parallel data bytes into the memory device, where the sampling module includes a plurality of first-in-first-out (FIFO) registers, the parallel data bytes are deposited into the FIFO registers, and the data path selector outputs the parallel data bytes from the FIFO registers into the memory device for storage; the FIFO registers are respectively connected to the serial-to-parallel converters which are respectively connected to the detection channels; the memory device includes a memory controller and a storage unit, and the memory controller causes the parallel data bytes to be input into the storage unit in sequential order; the storage unit includes a plurality of storage sectors, a first indicator and a second indicator, wherein each storage sector has the same number of bits as each of the parallel data bytes transferred from the data path selector, the first indicator is pointed to the storage sector where a first parallel data byte from the data path selector is predetermined to be stored in, and the second indicator is pointed to another storage sector where the memory controller causes a next parallel data byte to be stored in,
   wherein all the parallel data bytes stored in the FIFO registers are transferred and stored in the storage unit in sequential order; as the parallel data bytes continue to be input into the storage unit, the second indicator continues to point to the next storage sector until the storage unit reaches the full capacity;
   when the storage unit reaches full capacity, the second indicator is pointed to the same storage sector at which the first indicator is pointed to, and the first indicator is then moved to be pointed to another storage sector based on the predetermined number of the enabled detection channels.

5. The method according to claim 4, wherein a sampling sequence of the external signals generated by the external signal terminals has been controlled by a control signal transmitted by the control unit.

6. The method according to claim 4, wherein each serial-to-parallel converter further includes a converter controller and a serial-parallel shifter, the serial-parallel shifter receives the serial data and converts the serial data into the parallel data byte as described in the step c, and then the converter controller causes the data in the serial-parallel shifter to output the parallel data byte.

* * * * *